United States Patent
Park

(10) Patent No.: US 8,068,377 B2
(45) Date of Patent: Nov. 29, 2011

(54) SEMICONDUCTOR MEMORY DEVICE TO REDUCE OFF-CURRENT IN STANDBY MODE

(75) Inventor: Sang Il Park, Icheon-si (KR)

(73) Assignee: Hynix Semiconductor Inc., Icheon-si (KR)

(*) Notice: Subject to any disclaimer, the term of this patent is extended or adjusted under 35 U.S.C. 154(b) by 185 days.

(21) Appl. No.: 12/319,088

(22) Filed: Dec. 31, 2008

(65) Prior Publication Data

US 2010/0085817 A1    Apr. 8, 2010

(30) Foreign Application Priority Data

Oct. 2, 2008    (KR) .................. 10-2008-0097383

(51) Int. Cl.
*G11C 5/14* (2006.01)

(52) U.S. Cl. ............... 365/229; 365/219; 365/230.03; 365/238.5

(58) Field of Classification Search ............ 365/229, 365/219, 230.03, 238.5
See application file for complete search history.

(56) References Cited

U.S. PATENT DOCUMENTS

| 7,460,429 | B2 | 12/2008 | Schoenfeld |
| 7,463,057 | B1 | 12/2008 | Rahim et al. |
| 2008/0123423 | A1* | 5/2008 | Kim ................... 365/185.11 |
| 2008/0198679 | A1* | 8/2008 | Lysinger et al. .......... 365/229 |

FOREIGN PATENT DOCUMENTS

| KR | 10-2000-0046790 A | 7/2000 |
| KR | 10-2001-0005090 A | 1/2001 |
| KR | 10-2006-0011409 A | 2/2006 |

* cited by examiner

*Primary Examiner* — Jason Lappas

(74) *Attorney, Agent, or Firm* — John P. White; Cooper & Dunham LLP

(57) ABSTRACT

A semiconductor memory device capable of reducing off-current in a standby mode is provided. The semiconductor memory device includes an enable signal generating unit configured to receive a plurality of address decoding signals and generate a first enable signal to select a first cell block and a second enable signal to select a second cell block, and an internal voltage generating unit for generating an internal voltage by controlling a supply of a first voltage in accordance with the first or second enable signals.

15 Claims, 10 Drawing Sheets

SEMICONDUCTOR MEMORY DEVICE TO REDUCE OFF-CURRENT IN STANDBY MODE

TECHNICAL FIELD

The present disclosure relates to a semiconductor memory device and, more particularly, to a semiconductor memory device capable of reducing off-current in a standby mode.

BACKGROUND

Generally, a relatively low current consumption is required in a mobile semiconductor memory device, as compared with a main memory device or a graphic memory device. Therefore, a standby current consumption is a critical factor in the mobile memory device.

Recently, a memory device achieves a fast response speed by reducing gate pitch of a transistor and then reducing a threshold voltage of the transistor. However, the reduced threshold voltage of the transistor may cause a problem of increasing off-current in a standby mode. Particularly, in the case of a transistor to which a high voltage VPP is applied, the off-current is more increased inevitably.

In the case of the mobile memory device, an approach for reducing off-current by using a long channel transistor to which a high voltage is applied can be used. However, there is a limit to the off current reduction in such approach.

SUMMARY

In an aspect of this disclosure, a semiconductor memory device is provided that is capable of reducing off-current in a standby mode by controlling an internal voltage, which is supplied to an internal circuit, in accordance with enablement of a cell block in a memory bank.

In an embodiment, a semiconductor memory device includes an enable signal generating unit configured to receive a plurality of address decoding signals and generate a first enable signal to select a first cell block and a second enable signal to select a second cell block, and an internal voltage generating unit for generating an internal voltage by controlling supply of a first voltage in accordance with the first enable signal or second enable signal.

The first and second cell blocks share a bit line sense amplifier with each other.

The internal voltage generating unit prevents the first voltage from being supplied when the first and second enable signal are disabled.

In another embodiment, a semiconductor memory device includes an enable signal generating unit configured to receive a plurality of address decoding signal and generate an enable signal to select a cell block, and an internal voltage generating unit for generating an internal voltage by controlling supply of a first voltage in accordance with the enable signal.

The internal voltage generating unit generates the internal voltage by preventing a high voltage from being supplied when the enable signal is disabled, wherein the high voltage is higher than a supply voltage from an external circuit.

In another embodiment, a semiconductor memory device includes an internal voltage generating unit for generating an internal voltage by controlling supply of a first voltage in accordance with a first enable signal, which is enabled to select a first cell block, and a second enable signal, which is enabled to select a second cell block, an I/O switching signal generating unit for outputting an I/O switching signal, wherein the I/O switching signal generating unit is driven by the internal voltage, a main word line driving unit for driving a main word line, wherein the main word line driving unit is driven by the internal voltage, and a sub word line driving unit for driving a sub word line, wherein the sub word line driving unit is driven by the internal voltage.

In still another embodiment, a semiconductor memory device includes a first cell block control unit configured to receive a plurality of first address decoding signals, generate a first enable signal and output a plurality of first cell block control signals in accordance with the first enable signal, and a second cell block control unit configured to receive a plurality of second address decoding signals, generate a second enable signal and output a plurality of second cell block control signals in accordance with the first and second enable signals.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION OF PREFERRED EMBODIMENTS

Hereinafter, examples and embodiments of this disclosure will be described with reference to accompanying drawings. However, the examples and embodiments are for illustrative purposes only and are not intended to limit the scope of the invention.

Figure 1:
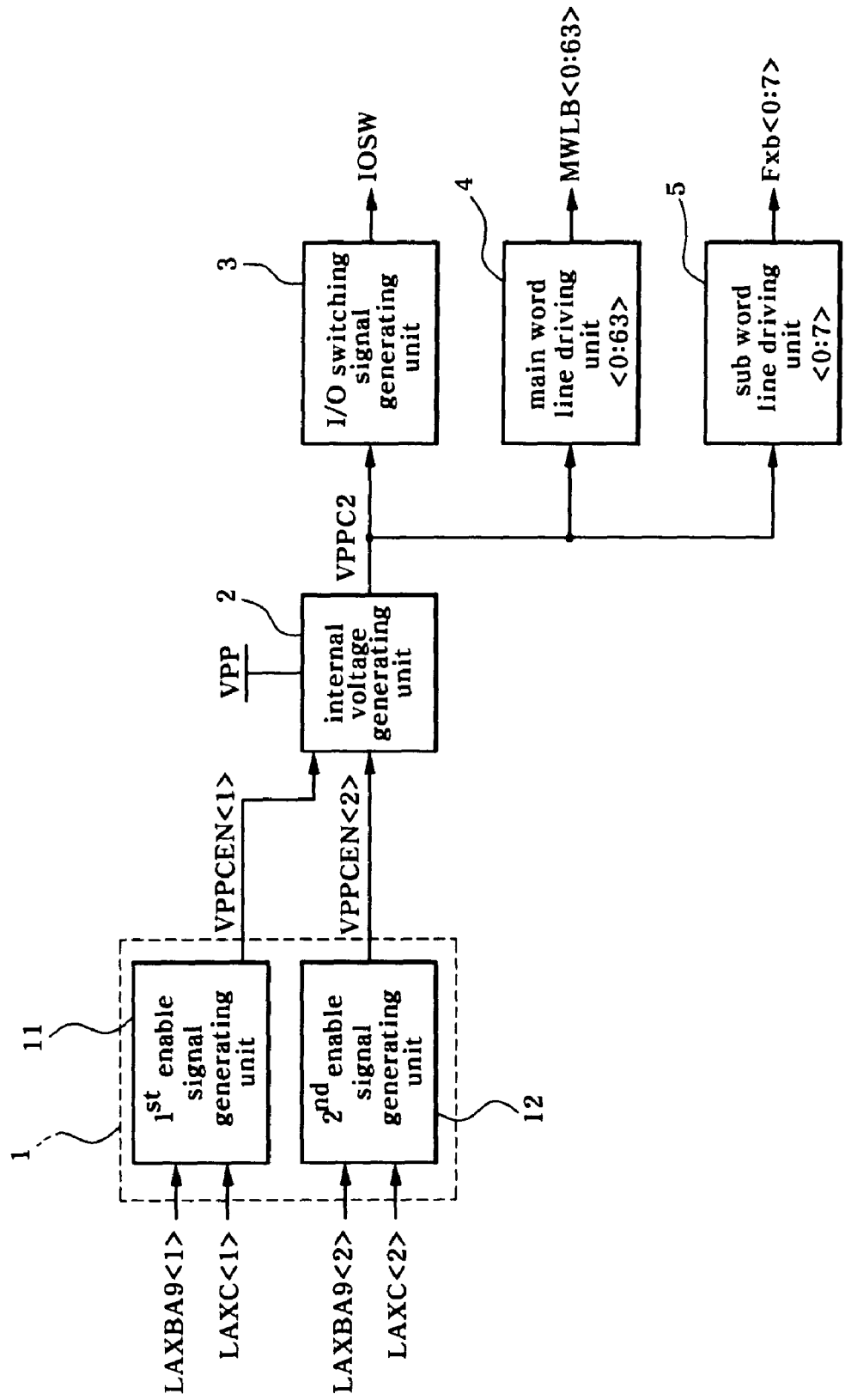
FIG. 1 is a block diagram illustrating an example of a structure of a semiconductor memory device, in accordance with an embodiment of this disclosure.

FIG. 1 is a block diagram illustrating an example of a structure of a semiconductor memory device in accordance with an embodiment of this disclosure.

Referring to FIG. 1, the semiconductor memory device in accordance with the embodiment includes an enable signal generating unit 1, an internal voltage generating unit 2, an I/O switching signal generating unit 3, a main word line driving unit 4, and a sub word line driving unit 5.

The enable signal generating unit 1 receives address decoding signals LAXBA9<1:2> and LAXC<1:2> and then generates a first enable signal VPPCEN<1> to select a first cell block and a second enable signal VPPCEN<2> to select a second cell block. Here, the first cell block shares a sense amplifier with the second cell block, and the first and second cell blocks are adjacent to each other. For example, the first cell block can be an upper cell block and the second cell block can be a lower cell block.

The internal voltage generating unit 2 generates an internal voltage VPPC2, using a supply voltage of a high voltage VPP, in accordance with the first enable signal VPPCEN<1> and the second enable signal VPPCEN<2>.

This internal voltage generating unit 2 generates the internal voltage VPPC2 by supplying the high voltage VPP when one of the first enable signal VPPCEN<1> and the second enable signal VPPCEN<2> is enabled, and generates the internal voltage VPPC2 by blocking the high voltage VPP when both the first enable signal VPPCEN<1> and the second enable signal VPPCEN<2> are disabled.

The I/O switching signal generating unit 3, which is driven by the internal voltage VPPC2, outputs a switching signal IOSW.

The main word line driving unit 4, which is driven by the internal voltage VPPC2, outputs a main word line signal MWLB<0:63>.

The sub word line driving unit 5, which is driven by the internal voltage VPPC2, outputs a sub word line signal Fxb<0:7>.

Figure 2:
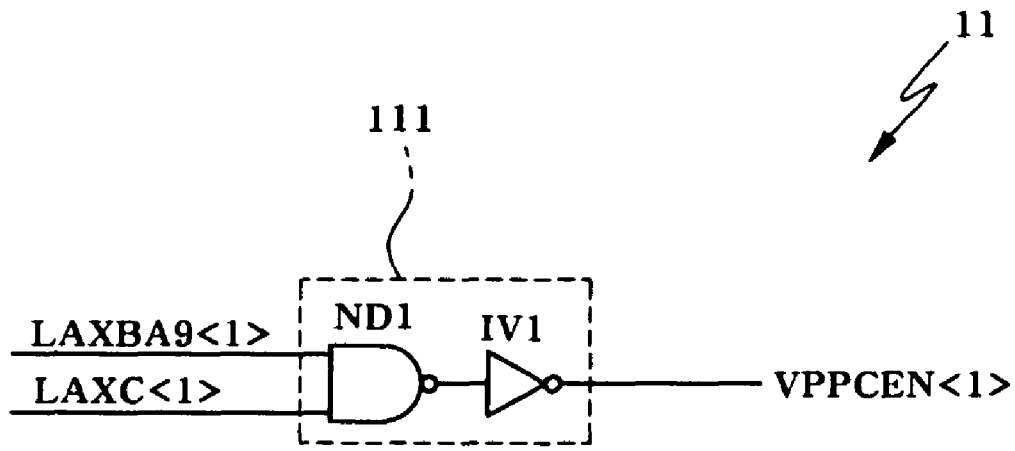
FIG. 2 is a circuit diagram illustrating an example of a structure of a first enable signal generating unit in the semiconductor memory device of FIG. 1.
Figure 3:
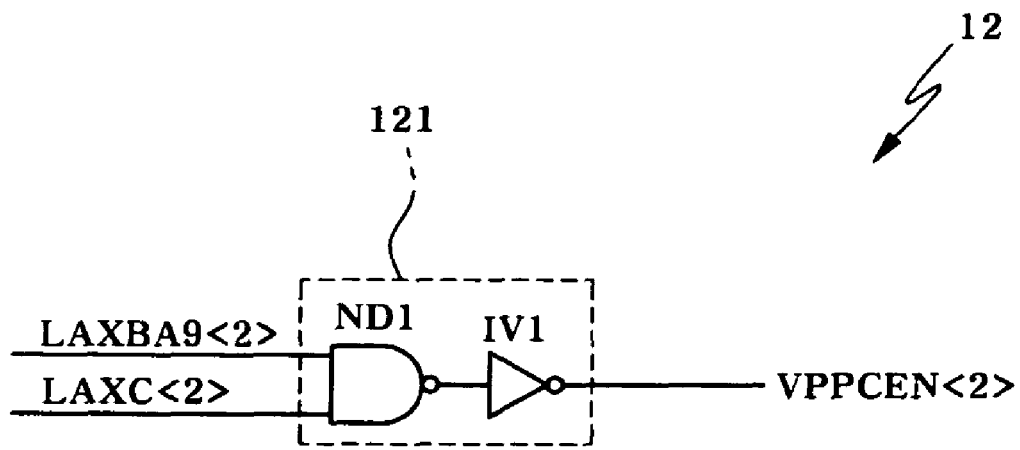
FIG. 3 is a circuit diagram illustrating an example of a structure of a second enable signal generating unit in the semiconductor memory device of FIG. 1.

FIG. 2 is a circuit diagram illustrating an example of a structure of the first enable signal generating unit 11 shown in FIG. 1, and FIG. 3 is a circuit diagram illustrating an example of a structure of the second enable signal generating unit 12 shown in FIG. 1.

Referring to FIG. 2, the first enable signal generating unit 11 includes a first enable signal output unit 111 which outputs the first enable signal VPPCEN<1> by NANDing the address decoding signals LAXBA9<1> and LAXC<1>.

Referring to FIG. 3, the second enable signal generating unit 12 includes a second enable signal output unit 121 which outputs the second enable signal VPPCEN<2> by NANDing the address decoding signals LAXBA9<2> and LAXC<2>.

This enable signal generating unit 1 outputs the enable signal VPPEN, which is enabled at a high level, when the address decoding signals LAXBA9 and LAXC are enabled at a high level to select the cell block.

Figure 4:
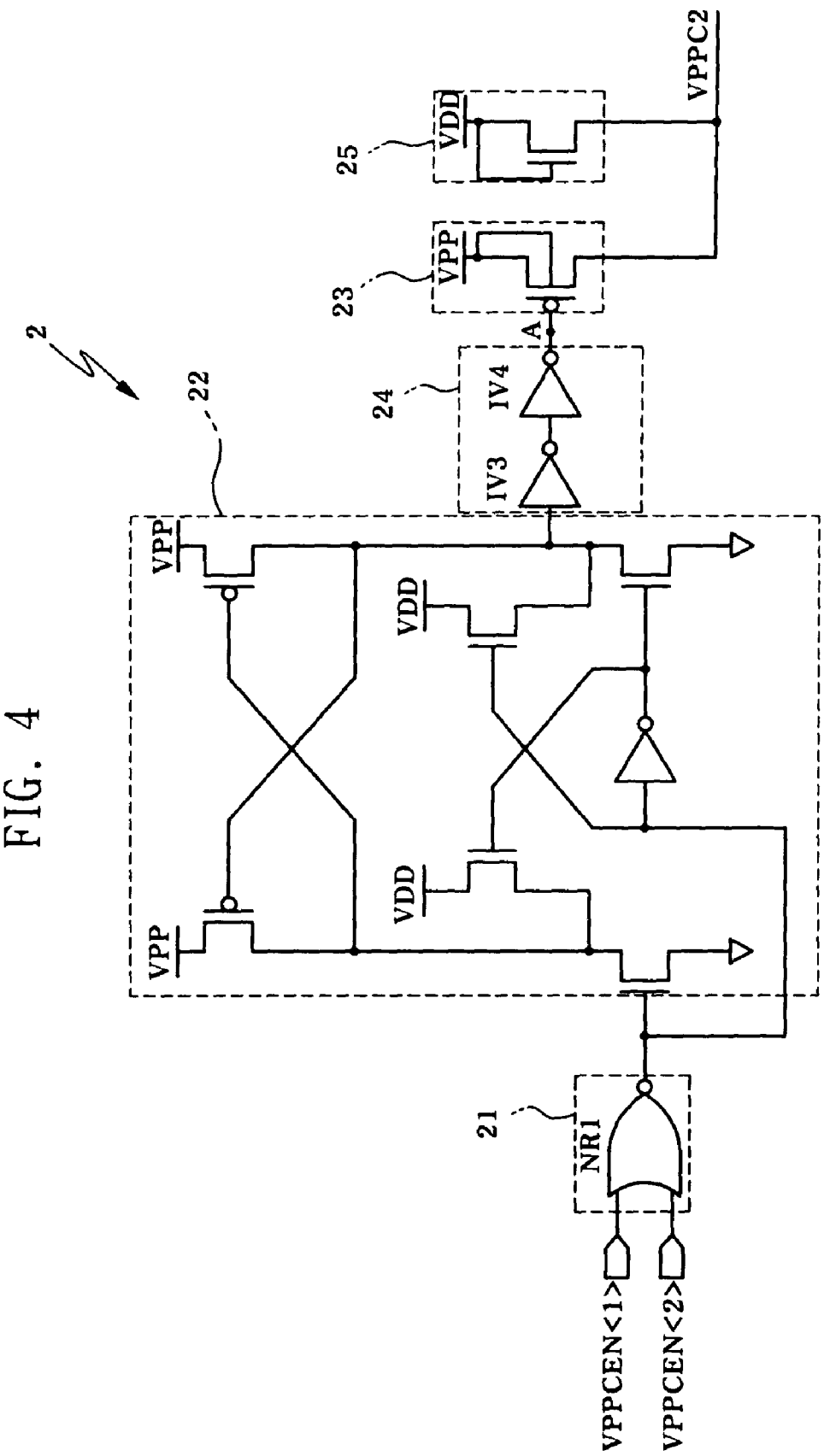
FIG. 4 is a circuit diagram illustrating an example of a structure of an internal voltage generating unit in the semiconductor memory device of FIG. 1.

FIG. 4 is a circuit diagram illustrating an example of a structure of the internal voltage generating unit 2 shown in FIG. 1.

Referring to FIG. 4, the internal voltage generating unit 2 includes an enable signal input unit 21 to logically combine the first enable signal VPPCEN<1> and the second enable signal VPPCEN<2>, a level shifting unit 22 to shift a voltage level of an output signal of the enable signal input unit 21, a buffer unit 24 to buffer an output signal of the level shifting unit 22, and an internal voltage driving unit 23 to drive the internal voltage VPPC2 based on the supply of the high voltage which is specified by the output signal of the level shifting unit 22.

Here, the enable signal input unit 21 can be a NOR gate NR1 and the internal voltage driving unit 23 can be a PMOS transistor.

The internal voltage generating unit 2 further includes a clamping unit 25 to which a supply voltage VDD is applied as a power source and coupled to an output node of the internal voltage driving unit 23. Here, the clamping unit 25 can be an NMOS transistor.

In this internal voltage generating unit 2, the internal voltage driving unit 23 is turned on in response to a low level on a node 'A' and then the high voltage VPP is supplied when one of the first and second enable signals VPPCEN<1> and VPPCEN<2> is enabled. Also, the internal voltage generating unit 2 turns off the internal voltage driving unit 23 in response to a high level on a node 'A' and then blocks the supply of the high voltage VPP when the first and second enable signals VPPCEN<1> and VPPCEN<2> are disabled.

The clamping unit 25 maintains the internal voltage VPPC2 at a voltage level of VDD-Vth when the internal voltage driving unit 23 is turned off, thereby making the internal voltage VPPC2 increase up to the high voltage VPP when the internal voltage driving unit 23 is turned on again.

Figure 5:
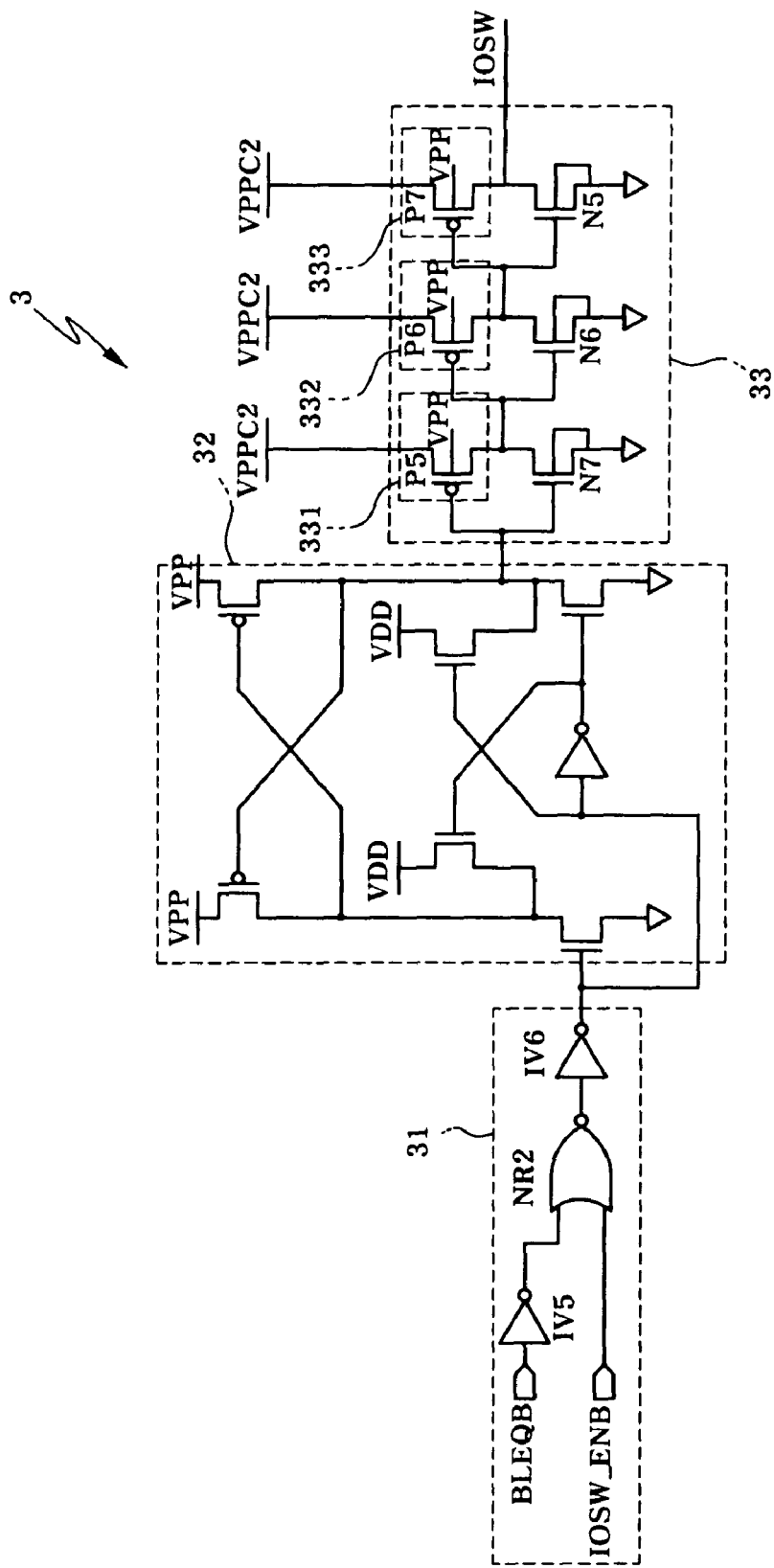
FIG. 5 is a circuit diagram illustrating an example of a structure of an I/O switching signal generating unit in the semiconductor memory device of FIG. 1.

FIG. 5 is a circuit diagram illustrating an example of a structure of the I/O switching signal generating unit 3 shown in FIG. 1.

The I/O switching signal generating unit 3 includes a switching signal input unit 31 to perform a logic operation of a switching enable signal IOSW_ENB and a precharge signal BLEQB, a level shifting unit 32 to shift a voltage level of an output signal of the switching signal input unit 31, and a buffer unit 33 to buffer an output signal of the level shifting unit 32. Here, the buffer unit 33 is driven by the internal voltage VPPC2.

Figure 6:
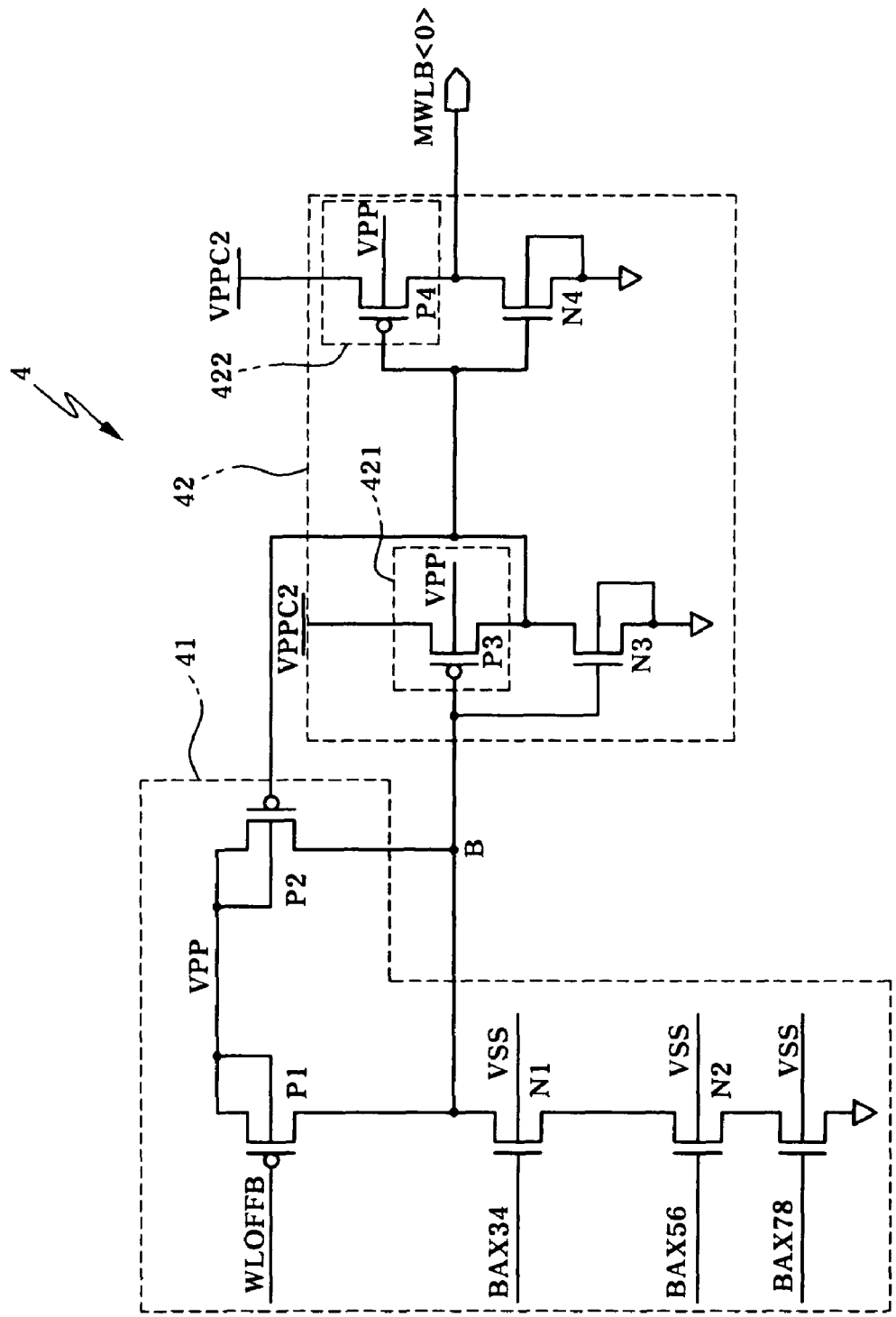
FIG. 6 is a circuit diagram illustrating an example of a structure of a main word line driving unit in the semiconductor memory device of FIG. 1.

FIG. 6 is a circuit diagram illustrating an example of a structure of the main word line driving unit 4 shown in FIG. 1.

Referring to FIG. 6, the main word line driving unit 4 includes a is first control unit 41 to output a main word line driving signal (node 'B') in response to a word line off signal WLOFFB and second address decoding signals BAX34, BAX56 and BAX78, and a first driving unit 42 to pull-up or pull-down drive a main word line in response to an output signal of the first control unit 41. Here, the second address decoding signals BAX34, BAX56, and BAX78 are decoding signals corresponding to address signals A3, A4, A5, A6, A7 and A8 to select the main word line. The first driving unit 42 is driven by the internal voltage VPPC2 which is input as a supply voltage.

Figure 7:
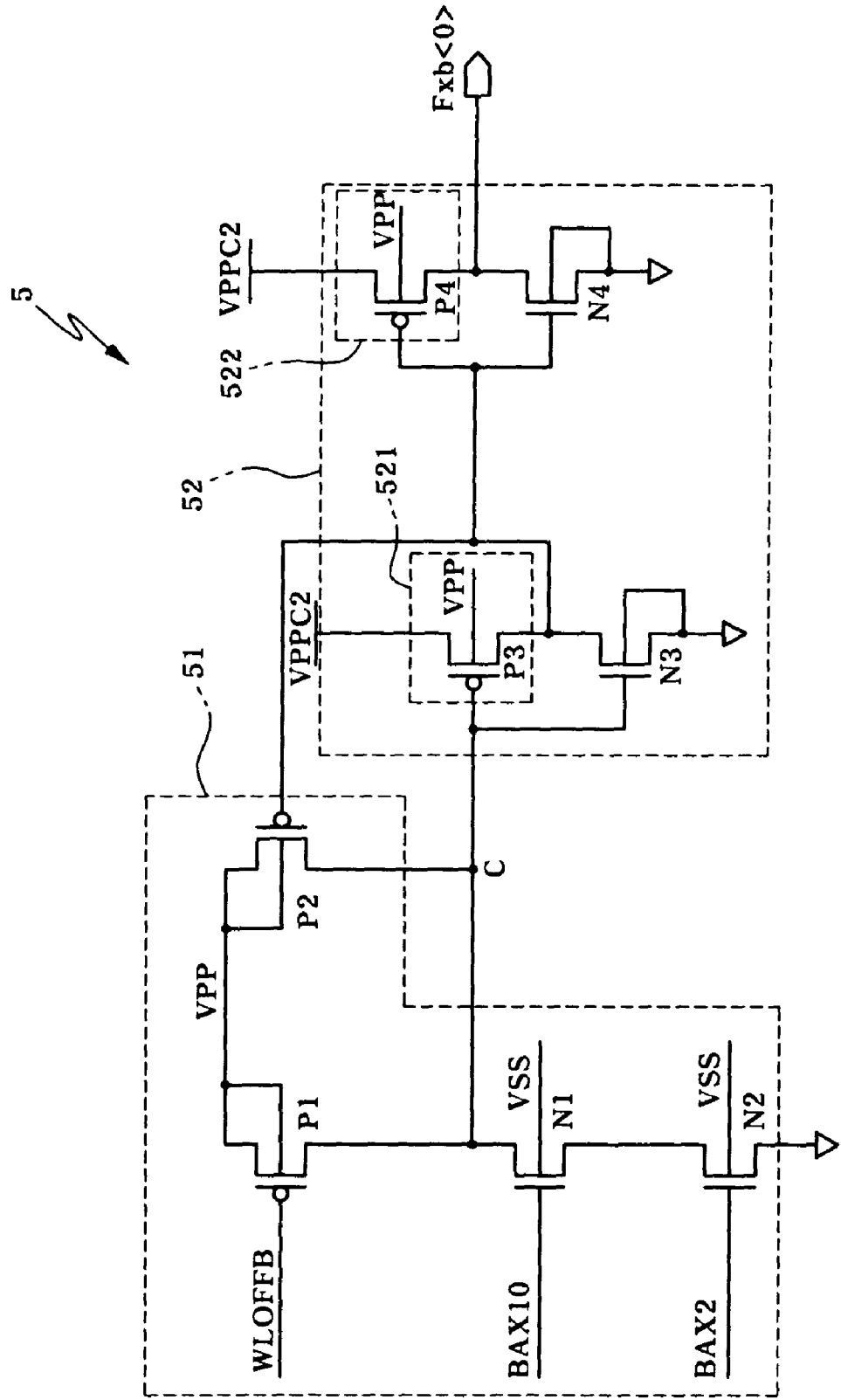
FIG. 7 is a circuit diagram illustrating an example of a structure of a sub word line driving unit in the semiconductor memory device of FIG. 1.

FIG. 7 is a circuit diagram illustrating an example of a structure of the sub word line driving unit 5 shown in FIG. 1.

Referring to FIG. 7, the sub word line driving unit 5 includes a second control unit 51 to output the sub word line driving signal Fxb in response to the word lone off signal WLOFFB and the third address decoding signals BAX10 and BAX2, and a second driving unit 52 for pull-up or pull-down driving the sub word line driving signal Fxb in response to an output signal of the second control unit 51. Here, the third address decoding signal BAX10 and BAX2 are decoding signals corresponding to address signals A0, A1 and A2 to select the sub word line and the second driving unit 52 is driven by the internal voltage VPPC2 which is input as a supply voltage.

Figure 8:
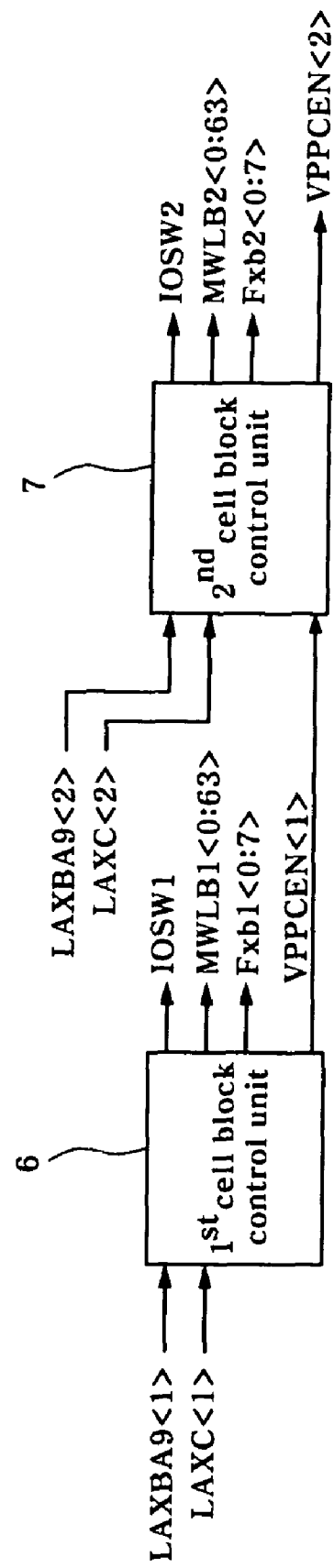
FIG. 8 is a block diagram illustrating an example of a structure of a semiconductor memory device having a plurality of cell block control units, in accordance with another embodiment of this disclosure.

FIG. 8 is a block diagram illustrating an example of a structure of a semiconductor memory device having a plurality of cell block control units, in accordance with another embodiment of this disclosure.

Referring to FIG. 8, the semiconductor memory device includes a first cell block control unit 6 and a second cell block control unit 7.

The first cell block control unit 6, which receives the first address decoding signals LAXBA9<1> and LAXC<1>, generates the first enable signal VPPCEN<1> and outputs first cell block control signals IOSW1, MWLB1<0:63> and Fxb1<0:7>, in accordance with the first enable signal VPPCEN<1>.

The second cell block control unit 7, which receives the second address decoding signals LAXBA9<2> and LAXC<2>, generates the second enable signal VPPCEN<2> and outputs second cell block control signals IOSW2, MWLB2<0:63> and Fxb2<0:7>, in accordance with the second enable signal VPPCEN<2>.

Figure 9:
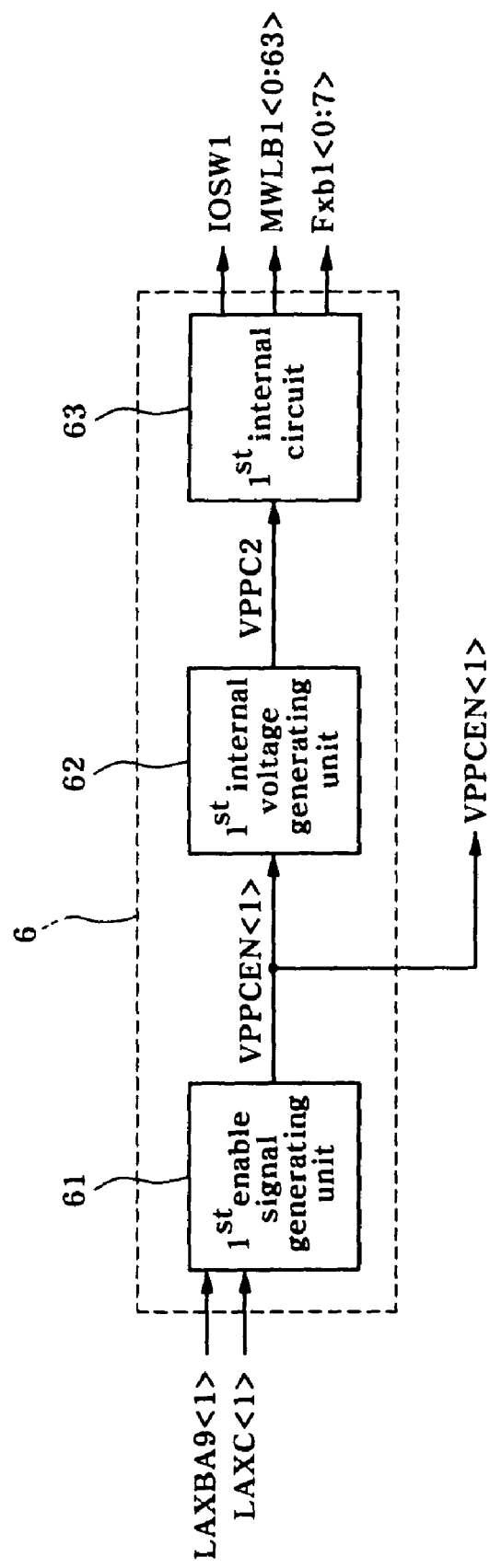
FIG. 9 is a block diagram illustrating an example of a structure of a first cell block control unit in the semiconductor memory device of FIG. 8.

FIG. 9 is a block diagram illustrating an example of a structure of the first cell block control unit 6 shown in FIG. 8.

Referring to FIG. 9, the first cell block control unit 6 includes a first enable signal generating unit 61 configured to receive the first address decoding signals LAXBA9<1> and LAXC<1> and then generate a first enable signal VPPCEN<1>, a first internal voltage generating unit 62 to generate the internal voltage VPPC2 in accordance with the first enable signal VPPCEN<1>, and a first internal circuit 63 driven by the internal voltage VPPC2 to output the first cell block control signals IOSW1, MWLB1<0:63> and Fxb1<0:7>.

Here, the configuration of the first enable signal generating unit 61 in FIG. 9 is the same as that in FIG. 2. The first internal circuit 63 includes circuits which are the same as the switching signal generating unit 3, the main word line driving unit 4, and the sub word line driving unit 5, respectively, shown in FIG. 1 and detailed circuit diagrams thereof are the same as those shown in FIGS. 5 to 7, respectively.

Figure 10:
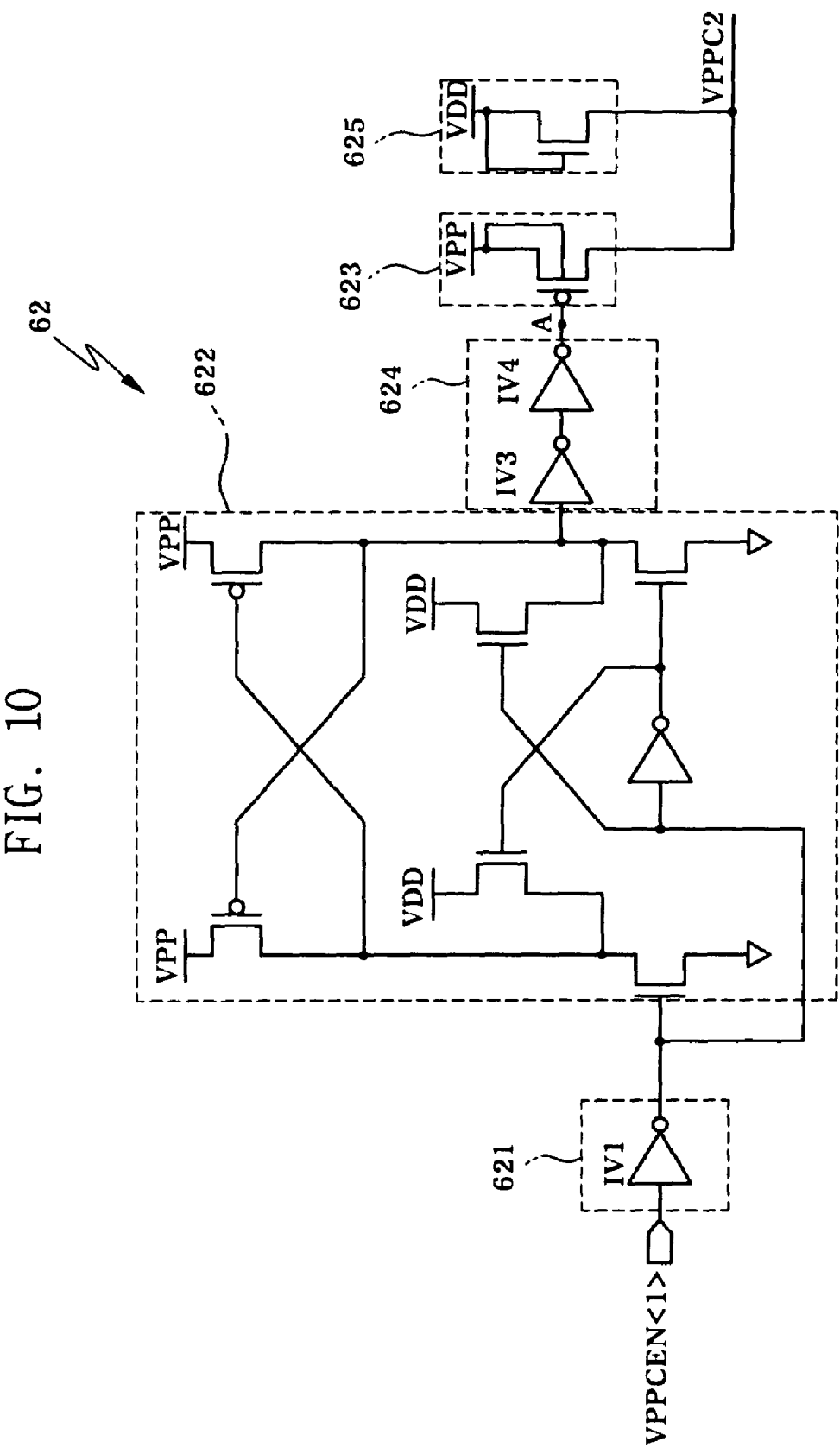
FIG. 10 is a circuit diagram illustrating an example of a structure of a first internal voltage generating unit in the semiconductor memory device of FIG. 9.

FIG. 10 is a circuit diagram illustrating an example of a structure of the first internal voltage generating unit 62 shown in FIG. 9.

Referring to FIG. 10, the first internal voltage generating unit 62 includes an enable signal input unit 621 to receive and buffer the first enable signal VPPCEN<1>, a level shifting unit 622 to output a level shifting signal in response to an output signal of the enable signal input unit 621, and an internal voltage driving unit 623 to drive the internal voltage VPPC2 by controlling the supply of the high voltage VPP in response to an output signal of the level shifting unit 622. Similar to the internal voltage generating unit 2 in FIG. 4, the first internal voltage generating unit 62 further includes a buffer unit 624 to buffer an output signal of the level shifting unit 621 and a clamping unit 625 to which a supply voltage VDD is applied as a power source.

This first internal voltage generating unit 62 generates the internal voltage VPPC2 by preventing the high voltage VPP from being supplied when the first enable signal VPPCEN<1> is disabled to a low level.

Figure 11:
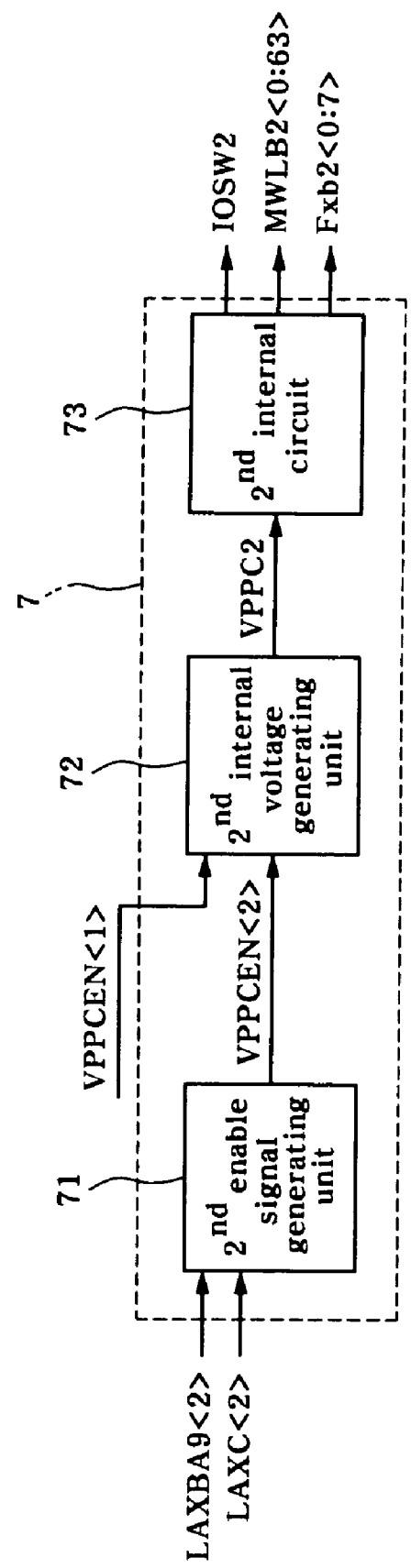
FIG. 11 is a block diagram illustrating an example of a structure of a second cell block control unit in the semiconductor memory device of FIG. 8.

FIG. 11 is a block diagram illustrating an example of a structure of the second cell block control unit 7 shown in FIG. 8.

Referring to FIG. 11, the second cell block control unit 7 includes a second enable signal generating unit 71 configured to receive the second address decoding signals LAXBA9<2> and LAXC<2> and then generate a second enable signal VPPCEN<2>, a second internal voltage generating unit 72 to generate the internal voltage VPPC2 in accordance with the second enable signal VPPCEN<2>, and a second internal circuit 73 driven by the internal voltage VPPC2 to output the second cell block control signals IOSW2, MWLB2<0:63> and Fxb2<0:7>.

Here, the configuration of the second enable signal generating unit 71 shown in FIG. 11 is the same as that of the second enable signal generating unit 12 shown in FIG. 3. The second internal circuit 73 includes circuits which are the same as the switching signal generating unit 3, the main word line driving unit 4, and the sub word line driving unit 5, respectively, shown in FIG. 1 and the detailed circuit diagrams thereof are the same as those shown in FIGS. 5 to 7, respectively.

This second internal voltage generating unit 72 generates the internal voltage VPPC2 by preventing the high voltage VPP from being supplied when the first and second enable signals VPPCEN<1> and VPPCEN<2> are disabled.

Operation of the semiconductor memory device in accordance with an embodiment of this disclosure will be described in detail below.

First, enablement of the internal voltage supply, in accordance with selection of the cell block, will be described.

Referring to FIG. 4, when any one of the first enable signal VPPCEN<1> to select the first cell block and the second enable signal VPPCEN<2> to select the second cell block is enabled at a high level, the voltage level on the node 'A' in the internal voltage generating unit 2 is at a low level so that the internal voltage driving unit 23 is turned on to output the internal voltage VPPC2. That is, the internal voltage generating unit 2 generates the internal voltage VPPC2 by supplying the high voltage VPP when one of the first and second cell blocks, which share the bit line sense amplifier with each other, is selected.

In more detail, when one of the first enable signal VPPCEN<1> from the first cell block and the second enable signal VPPCEN<2> from the second cell block is enabled at a high level, the enable signal input unit 21 outputs a low level signal and the level shifting unit 22, which receives and shifts the low level signal, outputs a low level signal. The node 'A', at the output terminal of the buffer unit 24, is at a low level. Accordingly, the internal voltage driving unit 23 is turned on in response to the low level signal on the node 'A' and the internal voltage VPPC2 is output with the supply of the high voltage VPP.

Therefore, the I/O switching signal generating unit 3, the main word line driving unit 4 and the sub word line driving unit 5, to which the internal voltage VPPC2 is applied, perform the active operation.

Next, disablement of the internal voltage supply, in accordance with non-selection of the selection of the cell block, will be described.

When both the first enable signal VPPCEN<1> to select the first cell block and the second enable signal VPPCEN<1> to select the second cell block are disabled at a low level, the internal voltage driving unit 23 is turned off and disables the internal voltage VPPC2. That is, the internal voltage generating unit 2 generates the internal voltage VPPC2 by blocking the high voltage VPP from being supplied when none of the first and second cell blocks, which share the bit line sense amplifier with each other, are selected in a standby mode.

In more detail, when the first enable signal VPPCEN<1> from the first cell block and the second enable signal VPPCEN<2> from the second cell block are disabled at a low level, the enable signal input unit 21 outputs a high level signal and the level shifting unit 22, which receives and shifts the high level signal, outputs a high level signal. The node 'A', at the output terminal of the buffer unit 24, is at a high level. Accordingly, the internal voltage driving unit 23 is turned on in response to the high level signal on the node 'A' and the internal voltage VPPC2 is output without the supply of the high voltage VPP.

At this time, since the I/O switching signal generating unit 3, the main word line driving unit 4, and the sub word line driving unit 5 operate based on the supply voltage VDD, as the internal voltage VPPC2, which is lower than the high voltage VPP, the off-current is reduced in the standby mode.

Although examples and embodiments of the present invention have been described for illustrative purposes, those skilled in the art will appreciate that various modifications, additions and substitutions are possible, without departing from the scope and spirit of this disclosure and the accompanying claims.

This disclosure claims priority to Korean application 10-2008-0097383, filed on Oct. 2, 2008, the entire contents of which are incorporated herein by reference.

What is claimed is:

1. A semiconductor memory device comprising:
    an enable signal generating unit configured to receive a plurality of address decoding signals and generate a first enable signal to select a first cell block and a second enable signal to select a second cell block; and
    an internal voltage generating unit configured to supply a first voltage to an internal voltage having a level of a supply voltage in accordance with at least one of the first and second enable signals,
    wherein the internal voltage generating unit includes:
    an enable signal input unit for logically combining the first and second enable signals;
    a level shifting unit for outputting a level shifting signal in response to an output signal of the enable signal input unit; and
    an internal voltage driving unit for driving the internal voltage by controlling the supply of the first voltage in accordance with an output signal of the level shifting unit.

2. The semiconductor memory device of claim 1, wherein the first and second cell blocks share a bit line sense amplifier with each other.

3. The semiconductor memory device of claim 1, wherein the internal voltage generating unit prevents the first voltage from being supplied when the first and second enable signal are disabled.

4. The semiconductor memory device of claim 3, wherein the first voltage is a high voltage that is higher than a supply voltage from an external circuit.

5. The semiconductor memory device of claim 1, wherein the plurality of address decoding signals include a plurality of first address decoding signals and a plurality of second address decoding signals, and wherein the enable signal generating unit includes:
    a first enable signal generating unit for generating the first enable signal by logically combining the plurality of the first address decoding signals; and
    a second enable signal generating unit for generating the second enable signal by logically combining the plurality of the second address decoding signals.

6. The semiconductor memory device of claim 1, wherein the internal voltage generating unit further includes a buffer unit between the level shifting unit and the internal voltage driving unit.

7. The semiconductor memory device of claim 1, wherein the internal voltage generating unit further includes a clamping circuit which receives a supply voltage from an external circuit and is coupled to an output node of the internal voltage driving unit.

8. The semiconductor memory device of claim 1, further comprising:
    an I/O switching signal generating unit for outputting an I/O switching signal in response to an I/O switching enable signal and a precharge signal, wherein the I/O switching signal generating unit is driven by the internal voltage;
    a main word line driving unit for driving a main word line in response to a word line off signal and a first subset of the address decoding signals that selects the main word line, wherein the main word line driving unit is driven by the internal voltage; and
    a sub word line driving unit for driving a sub word line in response to I the word line off signal and a second subset of the address decoding signals that selects the sub word line, wherein the sub word line driving unit is driven by the internal voltage.

9. The semiconductor memory device of claim 8, wherein the I/O switching signal generating unit includes:
    a switching signal input unit for performing a logic operation in response to the I/O switching enable signal and the precharge signal;
    a level shifting unit for shifting an output signal of the switching signal input unit; and
    a buffer unit for buffering an output signal of the level shifting unit,
    wherein the buffer unit receives, as a power supply voltage, the internal voltage.

10. The semiconductor memory device of claim 8, wherein the main word line driving unit includes:
    a first control unit for outputting a main word line driving signal in response to the word line off signal and the first set of the address decoding signals that selects the main word line; and
    a first driving unit for pull-up or pull-down driving the main word line in response to an output signal of the first control unit,
    wherein the first driving unit receives the internal voltage as a power supply voltage.

11. The semiconductor memory device of claim 8, wherein the sub word line driving unit includes:
    a second control unit for outputting a sub word line driving signal in response to the word line off signal and the second subset of the address decoding signals that selects the sub word line; and
    a second driving unit for pull-up or pull-down driving the sub word driving in response to an output signal of the second control unit,
    wherein the second driving unit receives, as a power supply voltage, the internal voltage.

12. A semiconductor memory device comprising:
    an enable signal generating unit configured to receive a plurality of address decoding signals and generate an enable signal to select a cell block; and
    an internal voltage generating unit configured to supply a first voltage to an internal voltage having a level of a supply voltage in accordance with the enable signal,
    wherein the internal voltage generating unit includes:
    an enable signal input unit for buffering the enable signals,
    a level shifting unit for outputting a level shifting signal in response to an output signal of the enable signal input unit, and
    an internal voltage driving unit for driving the internal voltage by controlling the supply of the first voltage in accordance with an output signal of the level shifting unit.

13. The semiconductor memory device of claim 12, wherein the internal voltage generating unit generates the internal voltage by preventing a high voltage from being supplied when the enable signal is disabled, wherein the high voltage is higher than a supply voltage from an external circuit.

14. The semiconductor memory device of claim 13, wherein the first voltage is the high voltage.

15. The semiconductor memory device of claim 12, wherein the internal voltage is supplied to an I/O switching signal generating unit, a main word line driving unit, and a sub word line driving unit.

* * * * *